United States Patent
Cheng et al.

(10) Patent No.: US 10,916,532 B2
(45) Date of Patent: Feb. 9, 2021

(54) MICRO LED DISPLAY PANEL AND METHOD FOR MAKING SAME

(71) Applicant: HON HAI PRECISION INDUSTRY CO., LTD., New Taipei (TW)

(72) Inventors: Jung-An Cheng, New Taipei (TW); I-Wei Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/397,475

(22) Filed: Apr. 29, 2019

(65) Prior Publication Data

US 2019/0355704 A1 Nov. 21, 2019

Related U.S. Application Data

(60) Provisional application No. 62/672,064, filed on May 16, 2018.

(51) Int. Cl.
*H01L 29/18* (2006.01)
*H01L 33/00* (2010.01)
*H01L 25/16* (2006.01)

(52) U.S. Cl.
CPC .................................. *H01L 25/167* (2013.01)

(58) Field of Classification Search
CPC ........... H01L 25/167; H01L 2933/0066; H01L 33/62; H01L 33/58; H01L 33/385; H01L 25/0753

See application file for complete search history.

(56) References Cited

U.S. PATENT DOCUMENTS

| 2005/0214963 | A1 | 9/2005 | Daniels et al. | |
| 2010/0038655 | A1* | 2/2010 | Chen | H01L 33/08 257/88 |
| 2017/0102797 | A1* | 4/2017 | Cok | H01L 25/167 |
| 2017/0271568 | A1* | 9/2017 | Chen | H01L 33/08 |
| 2017/0338212 | A1* | 11/2017 | Kuo | H01L 27/1225 |
| 2018/0158847 | A1* | 6/2018 | Chang | H01L 27/1259 |
| 2020/0052161 | A1* | 2/2020 | Wu | H01L 33/387 |

FOREIGN PATENT DOCUMENTS

CN 101088140 A 12/2007
WO 2017/123658 A1 7/2017

* cited by examiner

*Primary Examiner* — Ismail A Muse
(74) *Attorney, Agent, or Firm* — ScienBiziP, P.C.

(57) ABSTRACT

A micro LED display panel includes a back plate, a plurality of micro LEDs on the back plate, a first partition wall on a side of the back plate having the plurality of micro LEDs, an insulating layer on the back plate, and a common electrode on the insulating layer and covering the plurality of micro LEDs. The first partition wall divides the back plate into a plurality of light-emitting regions independent from each other. Each of the light-emitting regions is provided with one of the micro LEDs. The insulating layer is located in each of the light-emitting regions and surrounds each of the micro LEDs.

14 Claims, 15 Drawing Sheets

MICRO LED DISPLAY PANEL AND METHOD FOR MAKING SAME

FIELD

The subject matter herein generally relates to a micro light emitting diode (LED) display panel and a method for making the micro LED display panel.

BACKGROUND

A conventional method for manufacturing micro LED (light emitting diode) display panel includes steps of mounting micro LEDs on a back plate, and sequentially depositing a first insulating layer, a conductive layer, and a second insulating layer on the back plate. The steps of depositing the first insulating layer, the conductive layer, and the second insulating layer need a mask to accurately deposit the layers around the micro LEDs. The micro LEDs should be accurately installed on installation positions of back plate. Any misalignment of the micro LEDs will affect depositing of the first insulating layer, the conductive layer, and the second insulating layer.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
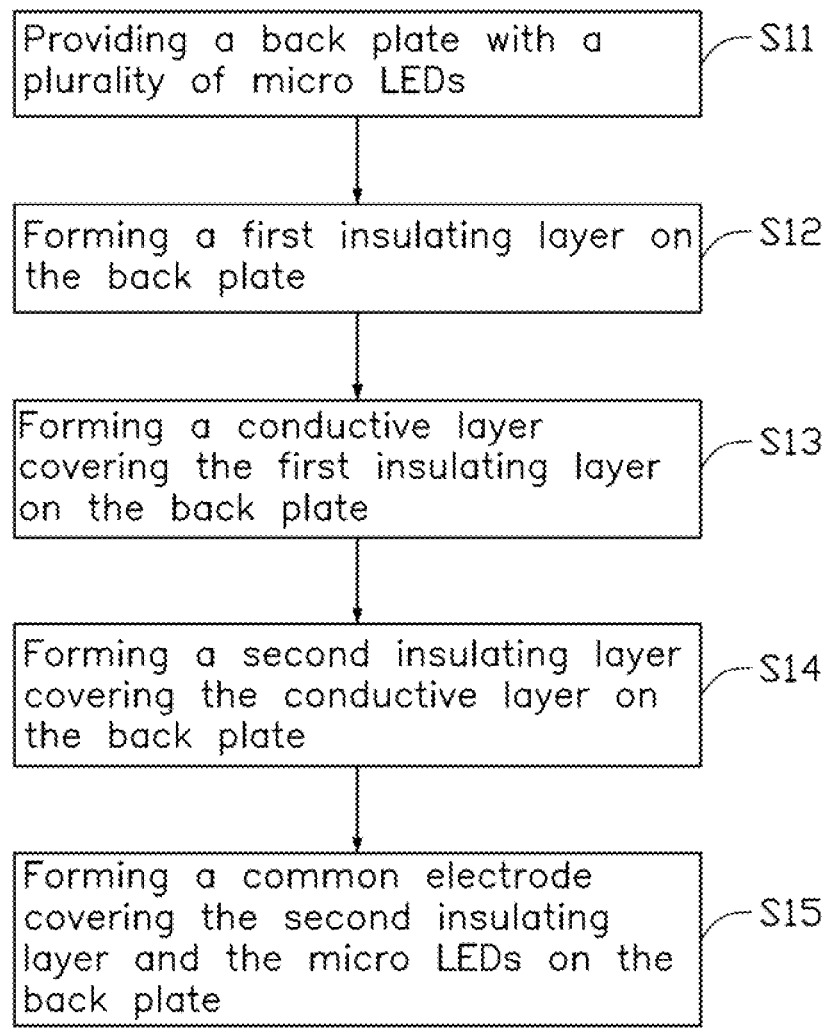
FIG. 1 is a flowchart of a method for making a micro LED display panel, of a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

First Embodiment

FIG. 1 illustrates a flowchart of a method for making a micro LED display panel, of a first embodiment. The example method is provided by way of example, as there are a variety of ways to carry out the method. Each block shown in FIG. 1 represents one or more processes, methods, or subroutines, carried out in the exemplary method. Furthermore, the illustrated order of blocks is by example only and the order of the blocks can be changed. The exemplary method can begin at block S11 according to the present disclosure. Depending on the embodiment, additional steps can be added, others removed, and the ordering of the steps can be changed.

At block S11, a back plate 11 with a plurality of micro LEDs 12 is provided.

Figure 2:
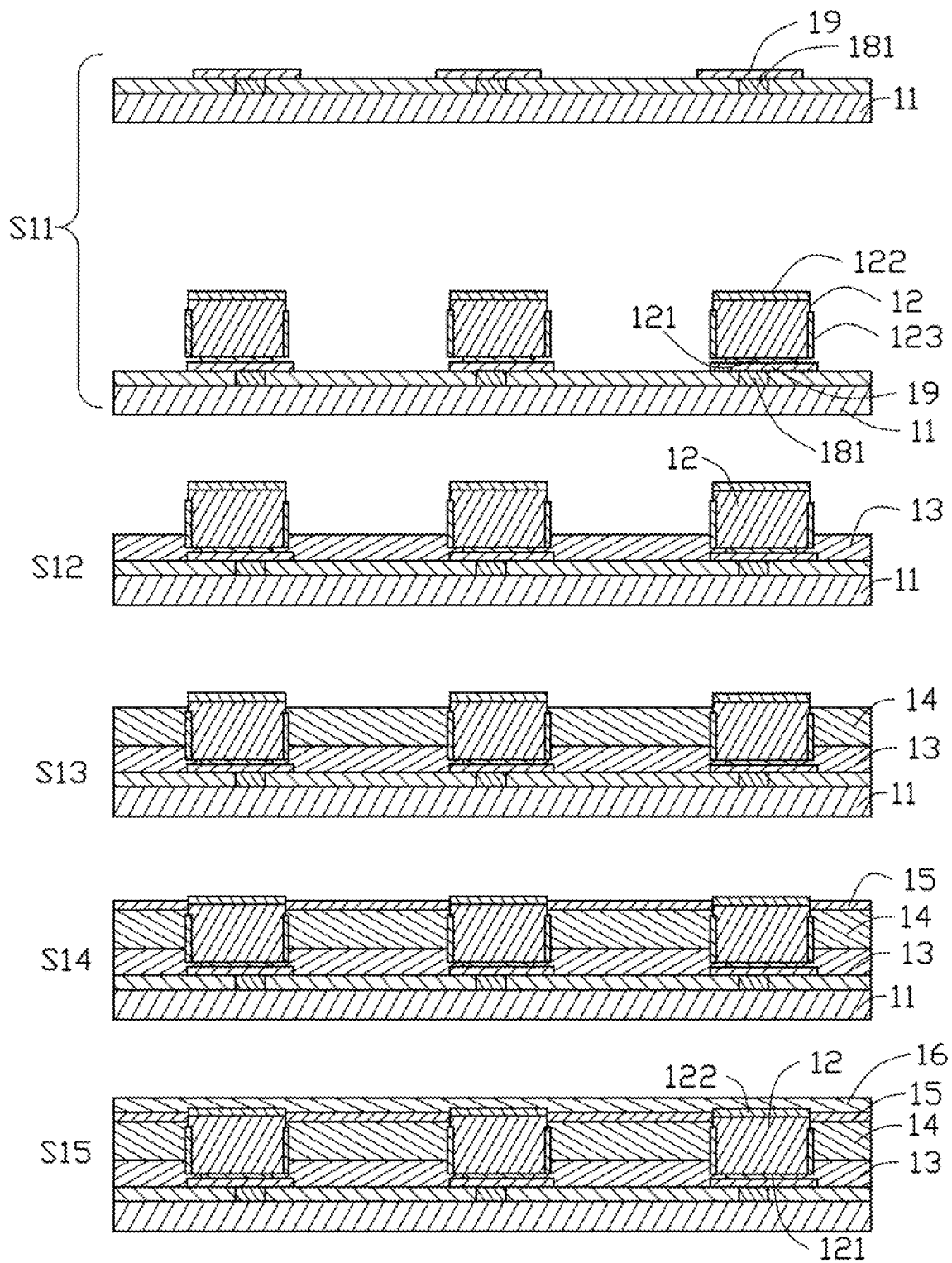
FIG. 2 shows cross-sectional views illustrating steps S11-S15 of the method of FIG. 1.

As shown in FIG. 2, block S11 specifically includes forming a plurality of first driving elements 181 on a surface of the back plate 11, depositing a solder 19 on each of the first driving elements 181, and forming a plurality of micro LEDs 12 on the solders 19. Each of the micro LEDs 12 is on a side of one of the solders 19 away from the back plate 11. Each of the micro LEDs 12 includes a lower electrode 121 and an upper electrode 122. The lower electrode 121 is electrically coupled to one of the first driving elements 181 by one solder 19. The first driving elements 181 can drive the micro LEDs 12 to emit light. In one embodiment, the first driving element 181 is thin film transistor (TFT), such as a low-temperature polysilicon TFT.

At block S12, a first insulating layer 13 is formed on the surface of the back plate 11 having the plurality of micro LEDs 12.

Specifically, as shown in FIG. 2, a first insulating layer 13 is formed on the back plate 11 by inkjet printing, the first insulating layer 13 covers region of the back plate 11 not covered by the micro LEDs 12. The first insulating layer 13 surrounds the micro LEDs 12.

At block S13, a conductive layer 14 covering the first insulating layer 13 is formed on the back plate 11.

Referring to FIG. 2, a conductive layer 14 is formed on the back plate 11 by inkjet printing; the conductive layer 14 covers the first insulating layer 13. In this embodiment, the micro LED 12 further includes a side electrode 123 between the lower electrode 121 and the upper electrode 122. The side electrode 123 is spaced apart from the lower electrode 121 and the upper electrode 122. The conductive layer 14 is electrically coupled to the side electrode 123 of each micro LED 12 to provide a bias voltage for the micro LED, which improves a performance of the micro LED and enhances the emitted illumination.

At block S14, a second insulating layer 15 covering the conductive layer 14 is formed on the back plate 11.

Referring also to FIG. 2, a second insulating layer 15 is formed on the backing plate 11 by inkjet printing; the second insulating layer 15 covers the conductive layer 14.

At block S15, a common electrode 16 covering the second insulating layer 15 and the micro LEDs 12 is formed on the back plate 11.

Referring to FIG. 2, a common electrode 16 is deposited on the back plate 11. In the present embodiment, the common electrode 16 covers the second insulating layer 15 and each of the micro LEDs 12. The common electrode 16 is electrically coupled to the upper electrode 122 of the micro LED 12. When a voltage is applied to the upper electrode 122 by the common electrode 16, and a different voltage is applied to the lower electrode 121 by the first driving element 181, a voltage differential between the upper electrode 122 and lower electrode 121 causes the micro LED 12 to emit light.

In the embodiment of the present disclosure, deposition of the first insulating layer 13, the conductive layer 14, and the second insulating layer 15 is carried out by inkjet printing. The ink droplets are in a liquid state and have a self-correcting characteristic, the first insulating layer 13, the conductive layer 14, and the second insulating layer 15 can be deposited uniformly and to be smoother. A certain degree of misaligning of the micro LED 12 does not affect the deposition of the first insulating layer 13, the conductive layer 14, and the second insulating layer 15.

The method of the micro LED display panel using inkjet printing technology greatly improves speed of this manufacturing process, and reduces probability of scratches occurring on receiving surface and contamination caused by mechanical errors or manual errors in the process.

Figure 3:
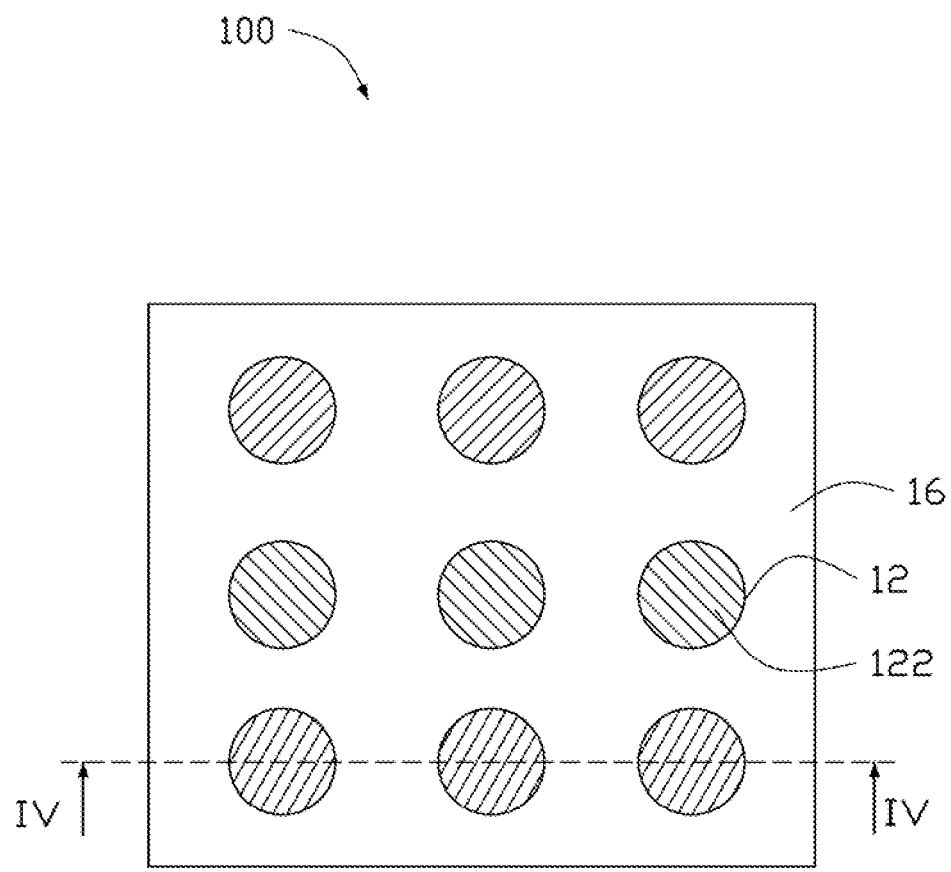
FIG. 3 is a bottom view of a micro LED display panel, of a first embodiment.
Figure 4:
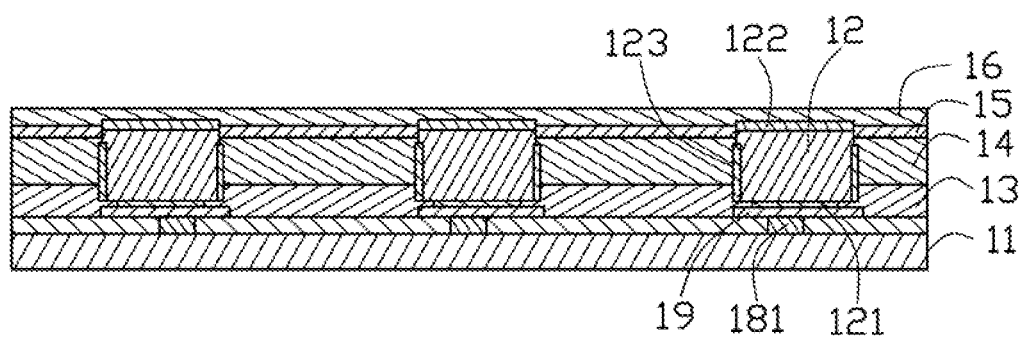
FIG. 4 is a cross-sectional view along line IV-IV of FIG. 3.

FIG. 3 and FIG. 4 illustrate a micro LED display panel 100 made by using the above described steps S11 to S15. The micro LED display panel 100 includes a back plate 11 and a plurality of micro LEDs 12 on the back plate 11. The micro LED display panel 100 further includes a first insulating layer 13 laminated on a side of the back plate 11, a conductive layer 14 laminated on a side of the first insulating layer 13 away from the back plate 11, and a second insulating layer 15 laminated on a side of the conductive layer 14 away from the back plate 11. Each micro LED 12 is embedded in the first insulating layer 13, the conductive layer 14, and the second insulating layer 15 and each micro LED 12 is surrounded by the first insulating layer 13, the conductive layer 14, and the second insulating layer 15. Each micro LED 12 includes an upper electrode 122, a lower electrode 121 opposite to the upper electrode 122, and a side electrode 123. The lower electrode 121 is on a side of the micro LED 12 adjacent to the back plate 11; the upper electrode 122 is on a side of the micro LED 12 away from the back plate 11. The side electrode 123 is between the upper electrode 122 and the lower electrode 121 and is spaced apart from both the upper electrode 122 and the lower electrode 121. That is, the lower electrode 121, the upper electrode 122, and the side electrode 123 are electrically insulated from each other. The side electrode 123 is in direct contact with the conductive layer 14. The conductive layer 14 is electrically coupled to the side electrode 123 of each micro LED 12 to provide the bias voltage for the micro LEDs 12.

A plurality of first driving elements 181 and a plurality of solders 19 are on a surface of the back plate 11. Each of the solders 19 is on a side of one of the first driving elements 181 away from the back plate 11, and each micro LED 12 is on a side of one solder 19 away from the back plate 11. Each of the first driving elements 181 is electrically coupled to the lower electrode 121 of the micro LED by a solder 19.

The micro LED display panel 100 further includes a common electrode 16 on the back plate 11, the common electrode 16 covers the second insulating layer 15 and each of the micro LEDs 12. The common electrode 16 is electrically coupled to the upper electrode 122 of the micro LED 12. When a voltage at one level is applied to the upper electrode 122 by the common electrode 16, and voltage at a different level is applied to the lower electrode 121 by the first driving element 181, the micro LED 12 can emit light.

In the first embodiment of the present disclosure, the first insulating layer 13, the conductive layer 14, and the second insulating layer 15 are all deposited by inkjet printing. The thickness of each deposition can be controlled by controlling the number or amount of the very small ink droplets.

Second Embodiment

Figure 5:
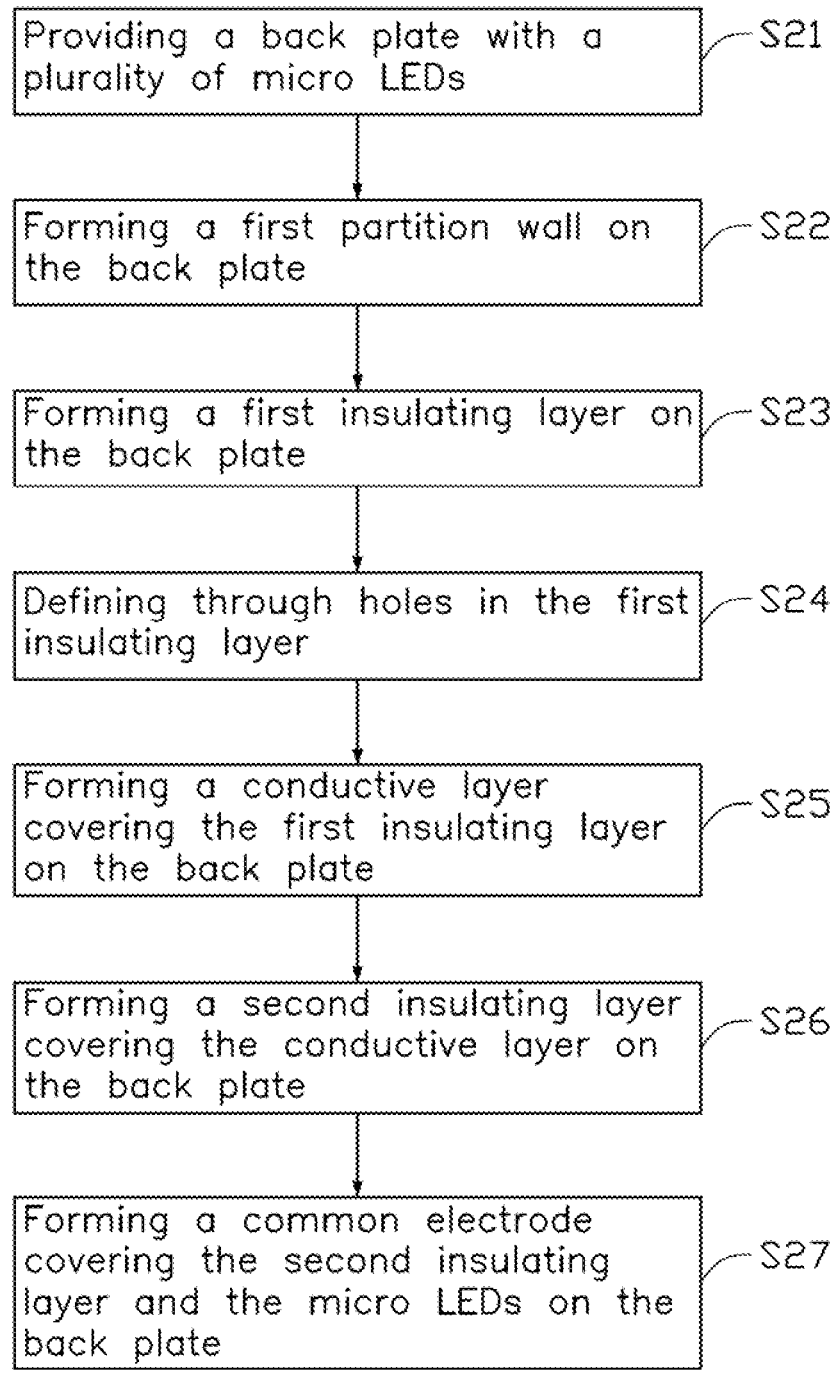
FIG. 5 is a flowchart of a method for making a micro LED display panel, of a second embodiment.

FIG. 5 illustrates a flowchart of a method for making a micro LED display panel of a second embodiment. The example method is provided by way of example, as there are a variety of ways to carry out the method. Each block shown in FIG. 5 represents one or more processes, methods, or subroutines, carried out in the exemplary method. Furthermore, the illustrated order of blocks is by example only and the order of the blocks can change. The exemplary method can begin at block S21 according to the present disclosure. Depending on the embodiment, additional steps can be added, others removed, and the ordering of the steps can be changed.

At block S21, a back plate 11 with a plurality of micro LEDs 12 is provided.

Figure 6:
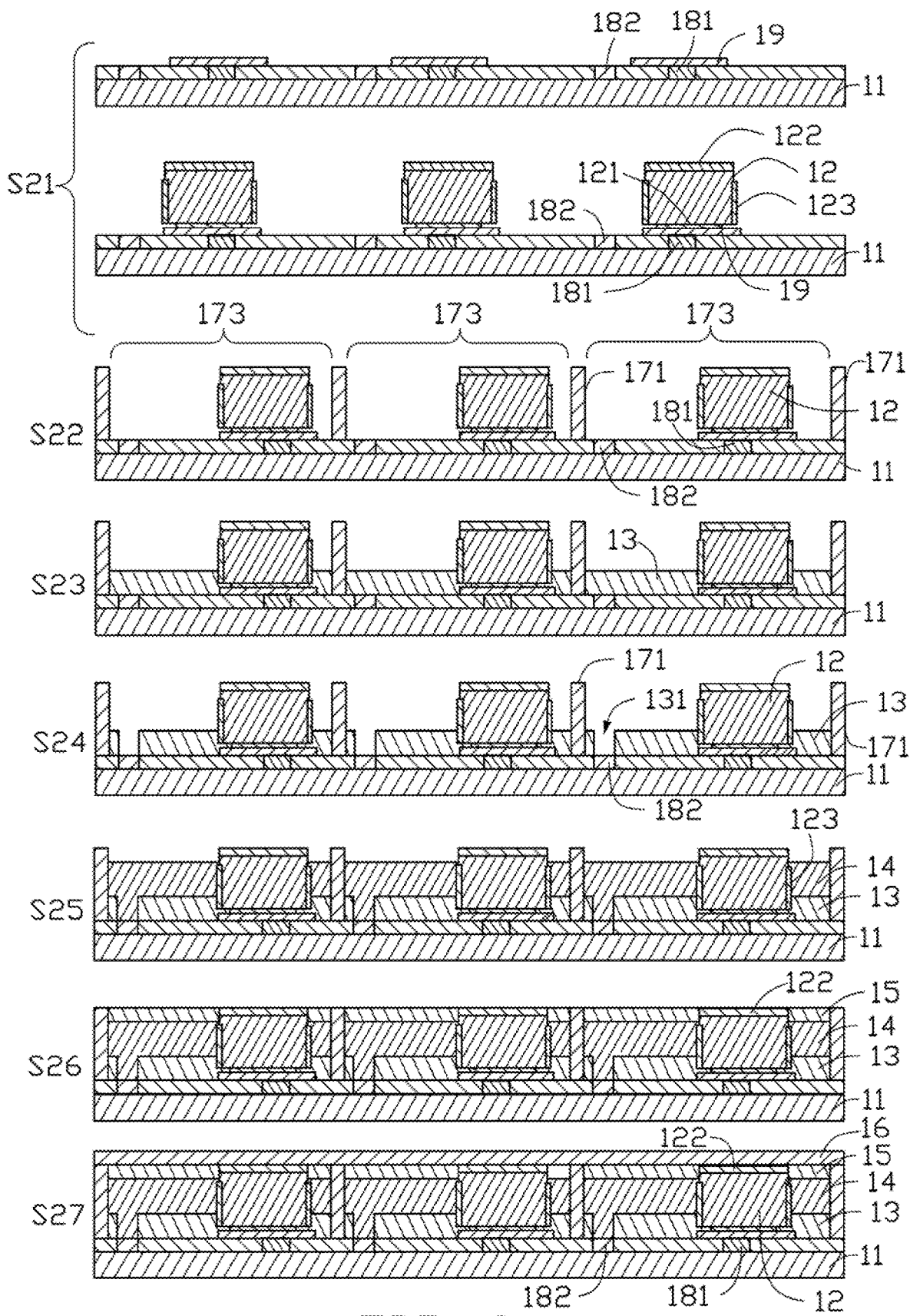
FIG. 6 shows cross-sectional views illustrating steps S21-S27 of the method of FIG. 5.

As shown in FIG. 6, block S21 specifically includes forming a plurality of first driving elements 181 and a plurality of second driving elements 182 on a surface of the back plate 11, depositing a solder 19 on each of the first driving elements 181, and forming a plurality of micro LEDs 12 on the solders 19. Each of the micro LEDs 12 is on a side of one of the solders 19 away from the back plate 11. Each of the micro LEDs 12 includes a lower electrode 121 and an upper electrode 122. The lower electrode 121 is electrically coupled to one of the first driving elements 181 by one solder 19. The first driving elements 181 can drive the micro LEDs 12 to emit light. In one embodiment, both the first driving element 181 and the second driving element 182 are TFTs, such as low-temperature polysilicon TFTs.

At block S22, as shown in FIG. 6, a first partition wall 171 is formed on the back plate 11.

The first partition wall 171 divides the back plate 11 into a plurality of independent light-emitting regions 173. One of the micro LEDs 12, one of the first driving elements 181, and one of the second driving elements 182 is located in each light-emitting region 173.

At block S23, as shown in FIG. 6, a first insulating layer 13 is formed on a surface of the back plate 11 having the plurality of micro LEDs 12.

The first insulating layer 13 can be formed by inkjet printing to cover the area of the back plate 11 not covered by the micro LEDs 12 and the first partition wall 171. The first insulating layer 13 surrounds the micro LEDs 12. The first insulating layer 13 covers the second driving elements 182.

The first insulating layer 13 has a thickness less than a thickness of the first partition wall 171.

At block S24, as shown in FIG. 6, a plurality of through holes 131 is defined in the first insulating layer 13 to expose the second driving elements 182. Each through hole 131 aligns with one second driving element 182. The through holes 131 can be formed by laser etching the first insulating layer 13.

At block S25, a conductive layer 14 covering the first insulating layer 13 is formed on the back plate 11.

The conductive layer 14 may be formed by inkjet printing. Referring to FIG. 6, the conductive layer 14 covers the first insulating layer 13 and also extends into the through holes 131, to electrically couple to the second driving elements 182. The conductive layer 14 does not cover the micro LEDs 12 and the first partition wall 171. In this embodiment, each micro LED 12 further includes a side electrode 123 between the lower electrode 121 and the upper electrode 122. The side electrode 123 is spaced from the lower electrode 121 and the upper electrode 122. The conductive layer 14 is electrically coupled to the side electrode 123, thus a bias voltage can be applied to the side electrode 123 from the second driving element 182 by the conductive layer 14. The bias voltage of the side electrode 123 of each micro LED 12 is independently controlled by the second driving elements 182.

At block S26, a second insulating layer 15 covering the conductive layer 14 is formed on the back plate 11.

Referring also to FIG. 6, a second insulating layer 15 is formed on the backing plate 11 by inkjet printing to cover the conductive layer 14.

At block S27, a common electrode 16 covering the second insulating layer 15 and the micro LEDs 12 is formed on the back plate 11.

Referring to FIG. 6, a common electrode 16 is deposited on the back plate 11. In the present embodiment, the common electrode 16 covers the second insulating layer 15 and each micro LED 12. The common electrode 16 is electrically coupled to the upper electrode 122 of the micro LED 12. When a voltage is applied to the upper electrode 122 by the common electrode 16, and a different voltage is applied to the lower electrode 121 by the first driving element 181, the voltage differential causes the micro LED 12 to emit light.

In the embodiment, deposition of the first insulating layer 13, the conductive layer 14, and the second insulating layer 15 is carried out by inkjet printing.

Additionally, the first partition wall 171 divides the back plate 11 into independent light-emitting regions 173. The method uses the inkjet printing technology and the first partition wall 171 to form the first insulating layer 13, the conductive layer 14, and the second insulating layer 15, and this process does not require the use of any mask.

The deposition of the first insulating layer 13, the conductive layer 14, and the second insulating layer 15 can be achieved by an inkjet printer (not shown). The number of liquid droplets ejected from the inkjet printer can be controlled to precisely control thicknesses of the first insulating layer 13, the conductive layer 14, and the second insulating layer 15 in each light-emitting regions 173.

For example, thicknesses of the first insulating layer 13, the conductive layer 14, and the second insulating layer 15 in each of the light-emitting regions can be designed and set according to a height of the micro LED 12 in each of the light-emitting regions 173.

Figure 7:
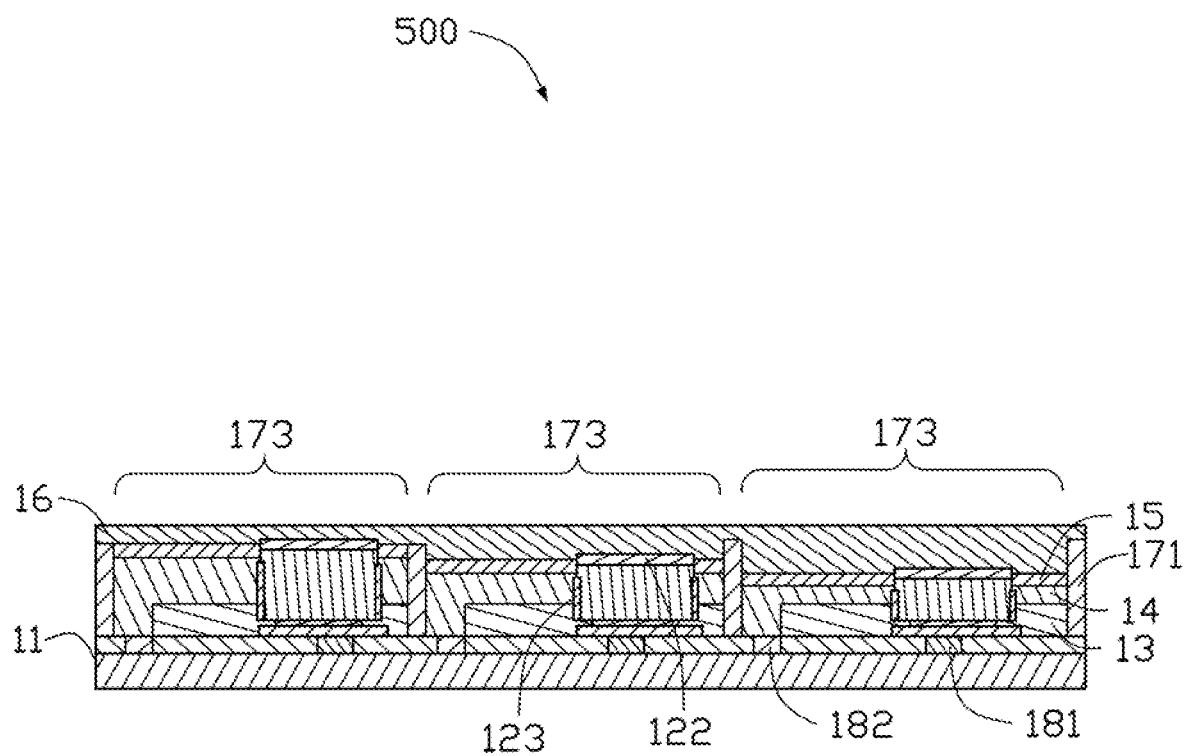
FIG. 7 is a cross-sectional view of a micro LED display panel, of a modified embodiment.

FIG. 7 illustrates a cross-section of a micro LED display panel 500. The micro LED display panel 500 includes three light-emitting regions 173, and the three micro LEDs 12 in the three light-emitting regions 173 have different thicknesses. For the actual product, the micro LEDs which emit different color lights may have different thicknesses. The thicknesses of the first insulating layer 13, the conductive layer 14, and the second insulating layer 15 can be accurately controlled by the liquid droplets applied during inkjet printing, and the overall total thickness can also be controlled. For example, thicknesses of the first insulating layer 13, of the conductive layer 14, and of the second insulating layer 15 in the three light-emitting regions 173 are different, but after the deposition of the common electrode 16 is completed, the micro LED display panel 500 has a uniform thickness. A thickness of the common electrode 16 in different light-emitting regions 173 is variable; the differences can guarantee a uniform thickness of the micro LED display panel 500.

Figure 8:
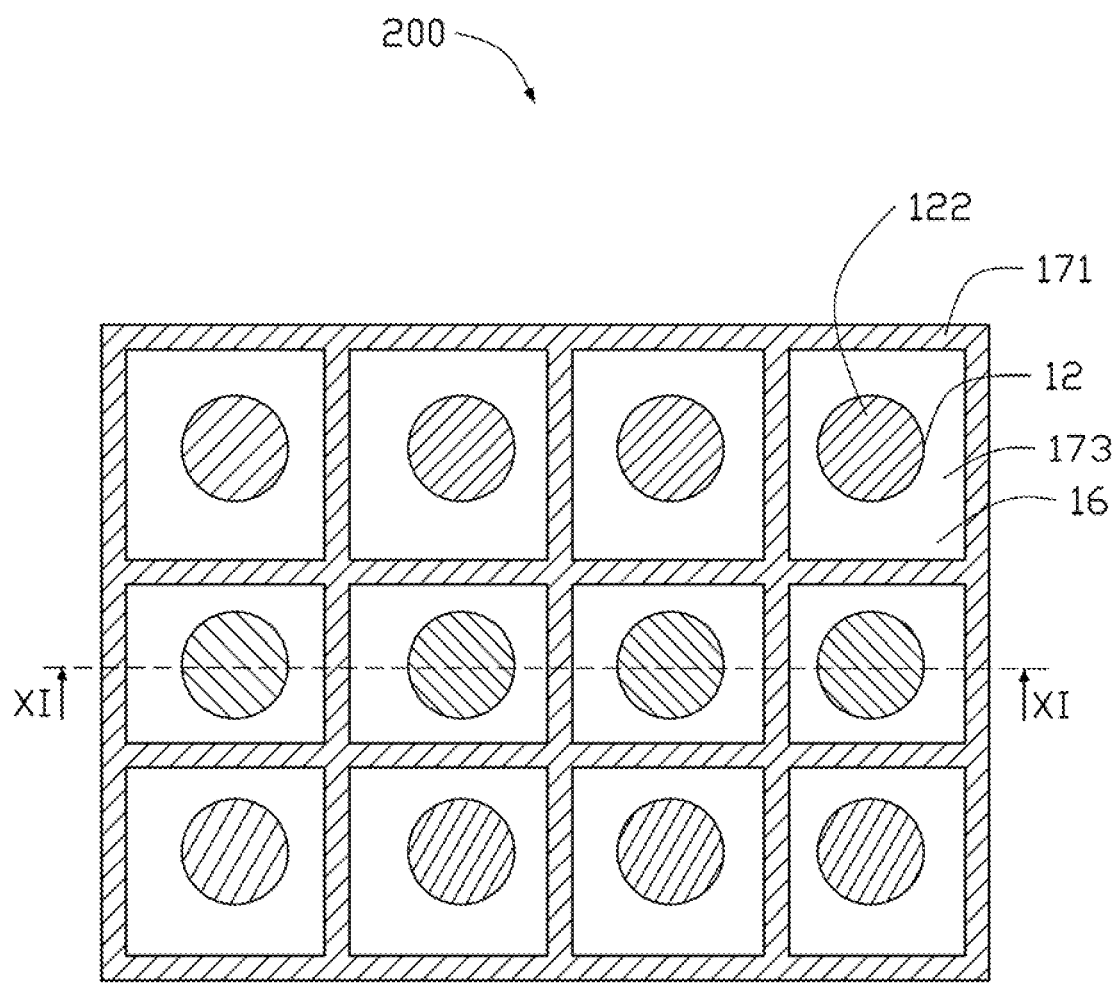
FIG. 8 is a bottom view of the micro LED display panel of the second embodiment.
Figure 9:
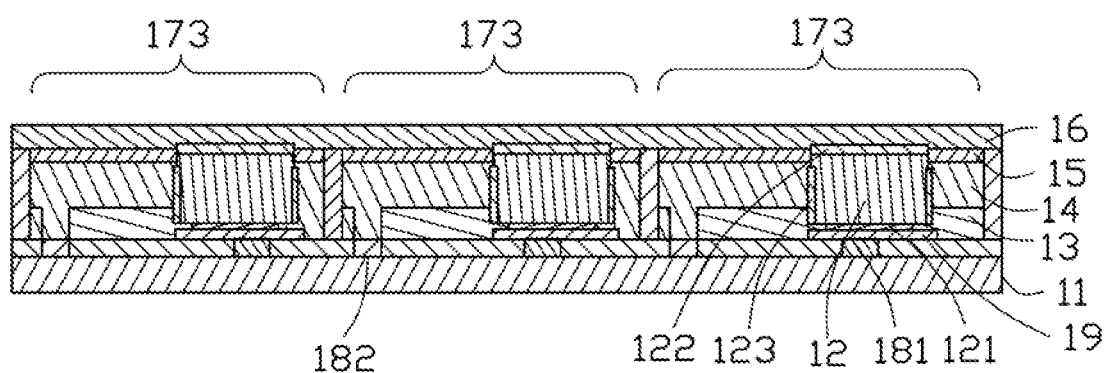
FIG. 9 is a cross-sectional view along line XI-XI of FIG. 8.

FIG. 8 and FIG. 9 illustrate a micro LED display panel 200 made by using the above described steps S21 to S27. The micro LED display panel 200 includes a back plate 11, a plurality of micro LEDs 12, and a first partition wall 171 on a side of the back plate 11. The first partition wall 171 divides the micro LED display panel 200 into a plurality of independent light-emitting regions 173, each of the light-emitting regions 173 has one micro LED 12 located therein. The micro LED display panel 200 further includes a first insulating layer 13 laminated on a side of the back plate 11, a conductive layer 14 laminated on a side of the first insulating layer 13 away from the back plate 11, and a second insulating layer 15 laminated on a side of the conductive layer 14 away from the back plate 11. The first insulating layer 13, the conductive layer 14, and the second insulating layer 15 are formed in the light-emitting regions 173 and do not cover sides of the first partition wall 171 and the micro LEDs 12 away from the back plate 11. A total thickness of the first insulating layer 13 and the conductive layer 14 is less than a thickness of the first partition wall 171. A total thickness of the first insulating layer 13, the conductive layer 14, and the second insulating layer 15 is not more than a thickness of the first partition wall 171. Each of the micro LEDs 12 is embedded in the first insulating layer 13, the conductive layer 14, and the second insulating layer 15 so as to be surrounded by the layers 13, 14, and 15.

Each of the micro LEDs 12 includes an upper electrode 122, a lower electrode 121 opposite to the upper electrode 122, and a side electrode 123. The lower electrode 121 is on a side of the micro LED 12 adjacent to the back plate 11; the upper electrode 122 is on a side of the micro LED 12 away from the back plate 11. The side electrode 123 is between the upper electrode 122 and the lower electrode 121 and is spaced from both the upper electrode 122 and the lower electrode 121. That is, the lower electrode 121, the upper electrode 122, and the side electrode 123 are electrically insulated from each other. The side electrode 123 is in direct contact with the conductive layer 14. The conductive layer 14 is electrically coupled to the side electrode 123 of each of the micro LEDs 12 to provide the bias voltage.

A plurality of first driving elements 181, a plurality of second driving elements 182, and a plurality of solders 19 are on a surface of the back plate 11. Each of the light-emitting regions 173 has one of the first driving elements 181 and one of the second driving elements 182 located therein. Each of the solders 19 is on a side of one of the first driving elements 181 away from the back plate 11, and each of the micro LEDs 12 is on a side of one of the solders 19 away from the back plate 11. Each of the first driving elements 181 is electrically coupled to the lower electrode 121 of the micro LED by the solder 19. A through hole 131 aligning with one of the second driving elements 182 is defined in a portion of the first insulating layer 13 in each of the light-emitting regions 173. The conductive layer 14 extends into the through hole 131. Each of the second driving elements 182 is electrically coupled to the conductive layer 14 to apply the bias voltage to the conductive layer 14.

The micro LED display panel 100 further includes a common electrode 16 on the back plate 11, the electrode 16 covers the second insulating layer 15 and each of the micro LEDs 12. The common electrode 16 is electrically coupled to the upper electrode 122 of the micro LED 12. When one voltage is applied to the upper electrode 122 by the common electrode 16, and a different voltage is applied to the lower electrode 121 by the first driving element 181, the micro LED 12 can emit light.

In the first embodiment of the present disclosure, the first insulating layer 13, the conductive layer 14, and the second insulating layer 15 are all deposited by inkjet printing, the deposition thickness being controlled by controlling the amount of ink droplets.

Third Embodiment

Figure 10:
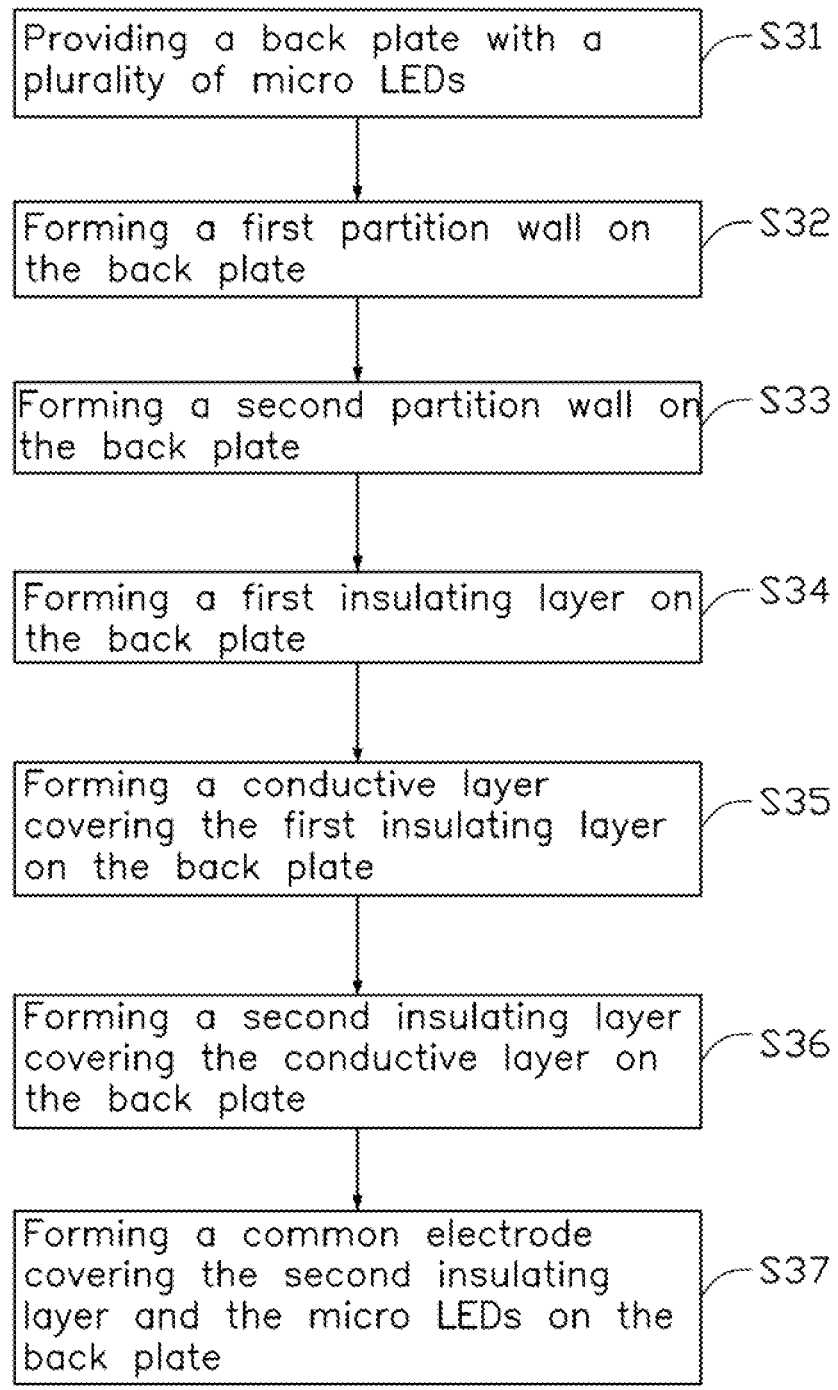
FIG. 10 is a flowchart of a method for making a micro LED display panel, of a third embodiment.

FIG. 10 illustrates a flowchart of a method for making a micro LED display panel of a third embodiment. The example method is provided by way of example, as there are a variety of ways to carry out the method. Each block shown in FIG. 10 represents one or more processes, methods, or subroutines, carried out in the exemplary method. Furthermore, the illustrated order of blocks is by example only and the order of the blocks can change. The exemplary method can begin at block S31 according to the present disclosure. Depending on the embodiment, additional steps can be added, others removed, and the ordering of the steps can be changed.

At block S31, a back plate 11 with a plurality of micro LEDs 12 is provided.

Figure 11:
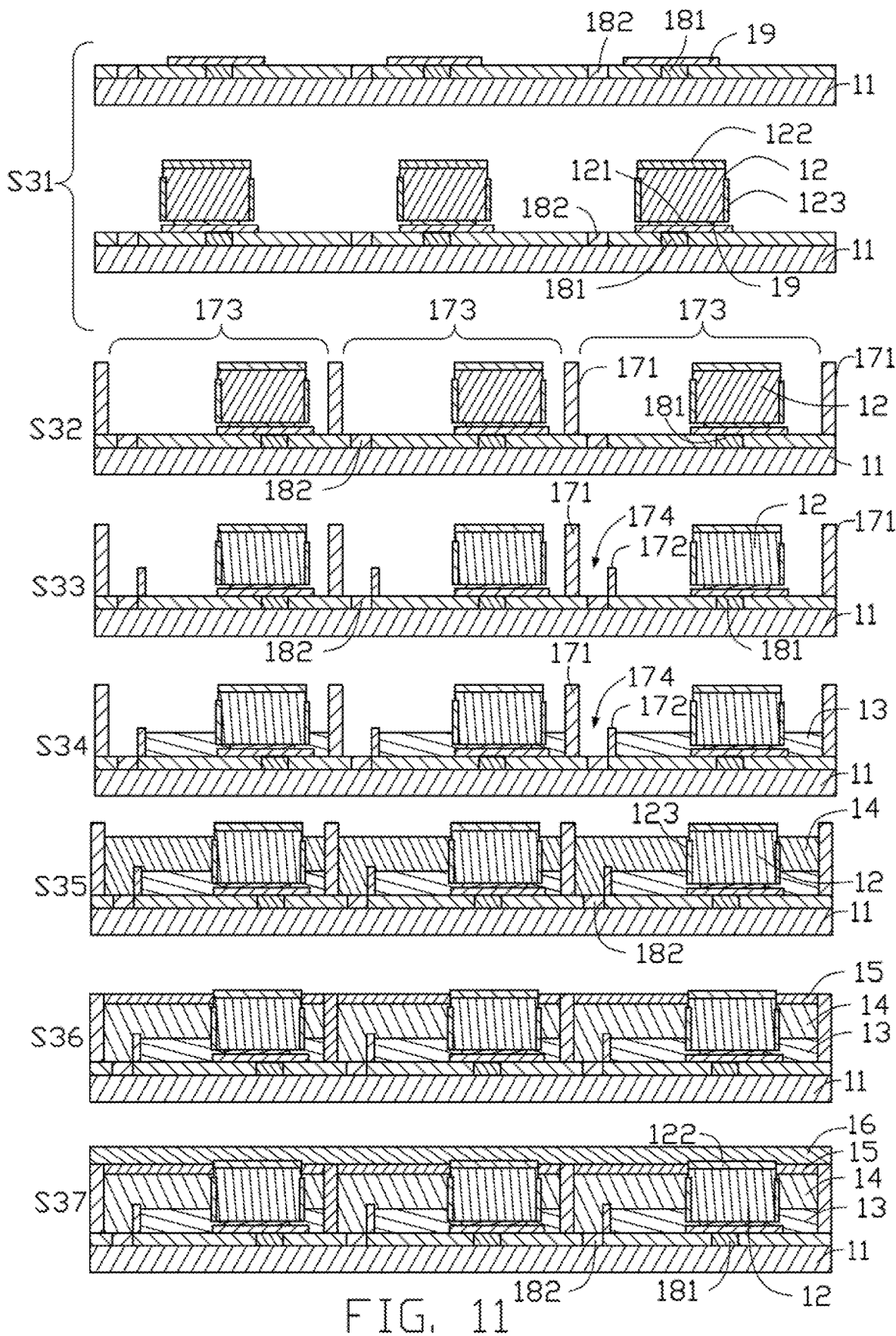
FIG. 11 shows cross-sectional views illustrating steps S31-S37 of the method of FIG. 10.

As shown in FIG. 11, block S31 is substantially the same as block S21 in the second embodiment. Block S31 specifically includes forming a plurality of first driving elements 181 and a plurality of second driving elements 182 on a surface of the back plate 11, depositing a solder 19 on each of the first driving elements 181, and transferring a plurality of micro LEDs 12 onto the solders 19. Each of the micro LEDs 12 is on a side of one of the solders 19 away from the back plate 11. Each of the micro LEDs 12 includes a lower electrode 121 and an upper electrode 122. The lower electrode 121 is electrically coupled to one of the first driving elements 181 by one of the solders. The first driving elements 181 can drive the micro LEDs 12 to emit light. In one embodiment, both the first driving element 181 and the second driving element 182 are TFTs, such as low-temperature polysilicon TFTs.

At block S32, as shown in FIG. 11, a first partition wall 171 is formed on the back plate 11.

As shown in FIG. 11, block S32 is substantially the same as block S22 in the second embodiment. The first partition wall 171 divides the back plate 11 into a plurality of independent light-emitting regions 173. One of the micro LEDs 12, one of the first driving elements 181, and one of the second driving elements 182 is located in each of the light-emitting regions 173.

At block S33, a plurality of second partition walls 172 is formed on the back plate 11. Each second partition wall 172 is in one light-emitting region 173. As shown in FIG. 11, a thickness of the second partition wall 172 is less than a thickness of the first partition wall 171. In each light-emitting region 173, each second partition wall 172 is between the first partition wall 171 and the micro LED 12. One second driving element 182 is located between the first partition wall 171 and one second partition wall 172. Each second partition wall 172 and the first partition wall 171 cooperate to form a groove 174, the groove 174 exposes the second driving element 182.

At block S34, as shown in FIG. 11, a first insulating layer 13 is formed on the surface of the back plate 11 having the plurality of micro LEDs 12. The first insulating layer 13 can be formed by inkjet printing and covers area of the back plate 11 not covered by the micro LEDs 12, the first partition wall 171, and the second partition walls 172. The first insulating layer 13 does not infill any of the grooves 174 and does not cover any of the second driving elements 182. The first insulating layer 13 surrounds the micro LEDs 12. The first insulating layer 13 has a thickness less than a thickness of the second partition wall 172.

At block S35, as shown in FIG. 11, a conductive layer 14 covering the first insulating layer 13 is formed on the back plate 11.

The conductive layer 14 may be formed by inkjet printing. Referring to FIG. 11, the conductive layer 14 covers the first insulating layer 13 and also extends into the grooves 174 to electrically couple to the second driving elements 182. The second partition wall 172 is embedded in the conductive layer 14. The conductive layer 14 does not cover the micro LEDs 12 or the first partition wall 171. In this embodiment, the micro LED 12 further includes a side electrode 123 between the lower electrode 121 and the upper electrode 122. The side electrode 123 is spaced apart from the lower electrode 121 and the upper electrode 122. The conductive layer 14 is electrically coupled to the side electrode 123, thus a bias voltage can be applied to the side electrode 123 from the second driving element 182 by the conductive layer 14. The bias voltage to the side electrode 123 of each micro LED 12 can be independently controlled by the second driving elements 182.

At block S36, a second insulating layer 15 covering the conductive layer 14 is formed on the back plate 11.

Referring to FIG. 11, a second insulating layer 15 is formed on the backing plate 11 by inkjet printing; the second insulating layer 15 covers the conductive layer 14.

At block S37, a common electrode 16 covering the second insulating layer 15 and the micro LEDs 12 is formed on the back plate 11.

Referring to FIG. 11, a common electrode 16 is deposited on the back plate 11. In the present embodiment, the common electrode 16 covers the second insulating layer 15 and each of the micro LEDs 12. The common electrode 16 is electrically coupled to the upper electrode 122 of the micro LED 12. When one voltage is applied to the upper electrode 122 by the common electrode 16, and a different voltage is applied to the lower electrode 121 by the first driving element 181, a voltage differential is formed between the upper electrode 122 and lower electrode 121 of the micro LED 12 and the micro LED 12 can emit light.

In the embodiment, deposition of the first insulating layer 13, the conductive layer 14, and the second insulating layer 15 is carried out by inkjet printing. The deposition of the first insulating layer 13, the conductive layer 14, and the second insulating layer 15 can be achieved by an inkjet printer (not shown). The number of liquid droplets ejected from the inkjet printer can be controlled to precisely control thicknesses of the first insulating layer 13, the conductive layer 14, and the second insulating layer 15 in each light-emitting region 173.

For example, thicknesses of the first insulating layer 13, the conductive layer 14, and the second insulating layer 15 in each of the light-emitting regions 173 can be designed and set according to a height of the micro LED 12 in each of the light-emitting regions 173.

Figure 12:
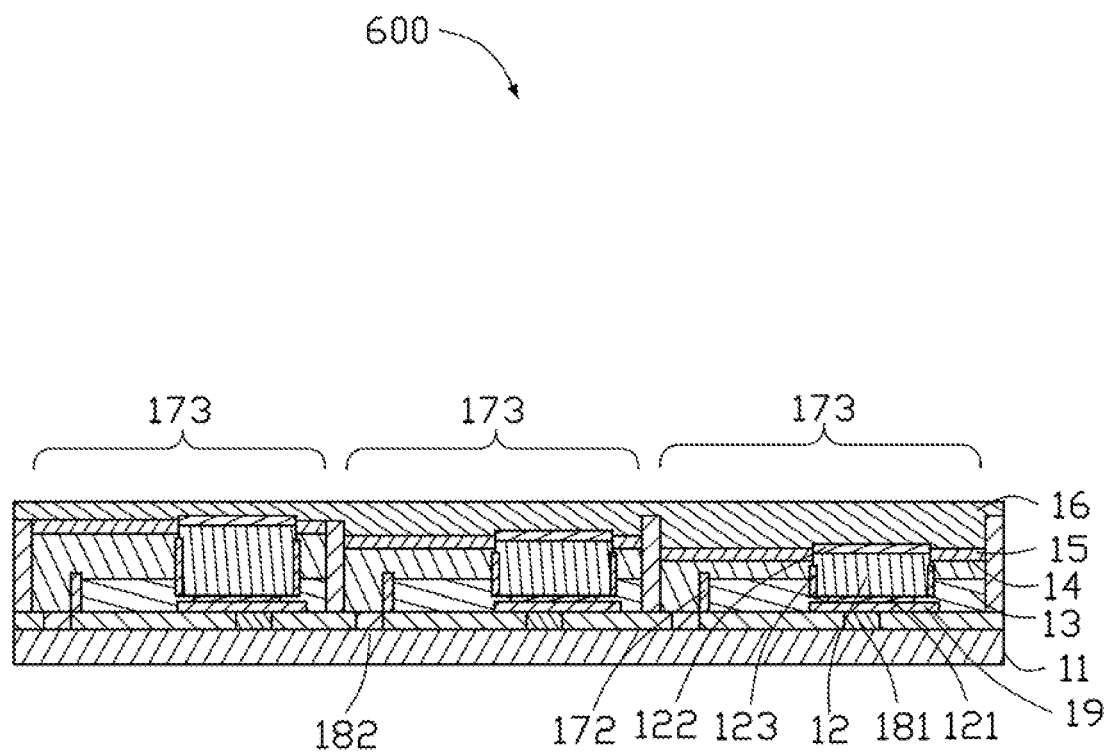
FIG. 12 is a cross-sectional view of a micro LED display panel of a third embodiment.

FIG. 12 illustrates a cross-section of a micro LED display panel 600. The micro LED display panel 600 includes three light-emitting regions 173, and the three micro LEDs 12 in the three light-emitting regions 173 have different thicknesses. The micro LED display panel 600 is substantially the same as the micro LED display panel 500, one difference is that the micro LED display panel 600 further includes a plurality of second partition walls 172 on the back plate 11.

The thicknesses of the first insulating layer 13, the conductive layer 14, and the second insulating layer 15 can be accurately controlled by controlling amounts of the liquid droplets during inkjet printing. For example, total thicknesses of the first insulating layer 13, the conductive layer 14, and the second insulating layer 15 in different light-emitting regions 173 can be different. After the deposition of the common electrode 16 is completed, the micro LED display panel 500 can thus have a uniform thickness. A thickness of the common electrode 16 in different light-emitting regions can be different to guarantee an overall uniform thickness of the micro LED display panel 600.

Figure 13:
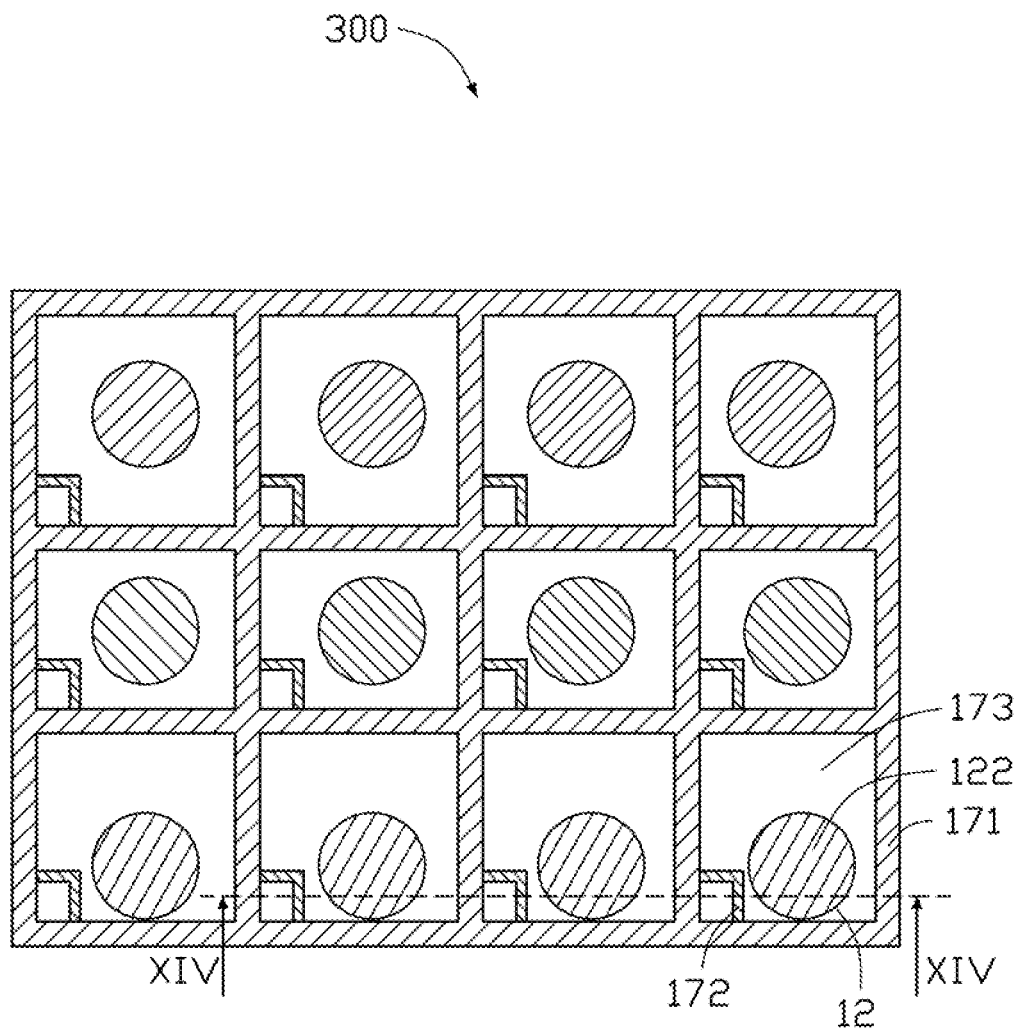
FIG. 13 is a bottom view of the micro LED display panel of the third embodiment.
Figure 14:
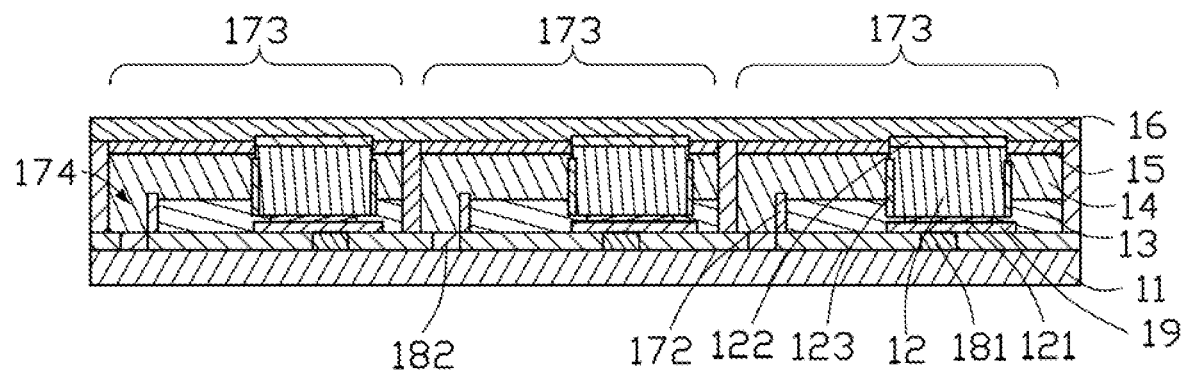
FIG. 14 is a cross-sectional view along line XV-XV of FIG. 13.

FIG. 13 and FIG. 14 illustrate a micro LED display panel 300 made by using the above described steps S31 to S37. The micro LED display panel 300 includes a back plate 11, a plurality of micro LEDs 12, a first partition wall 171, and a plurality of second partition walls 172 on a side of the back plate 11. The first partition wall 171 divides the micro LED display panel 200 into a plurality of independent light-emitting regions 173; each of the light-emitting regions 173 has one of micro LED 12 and one second partition wall 172 therein.

A plurality of first driving elements 181, a plurality of second driving elements 182, and a plurality of solders 19 are on a surface of the back plate 11. Each of the light-emitting regions 173 has one of the first driving elements 181 and one of the second driving elements 182 located therein. Each of the solders 19 is on a side of one of the first driving elements 181 away from the back plate 11, and each of the micro LEDs 12 is on a side of one of the solders 19 away from the back plate 11.

A thickness of the second partition wall 172 is less than a thickness of the first partition wall 171. Each second partition wall 172 and the first partition wall 171 cooperate to form a groove 174; the second driving element 182 is under the groove 174. Each of the light-emitting regions 173 is divided into two portions by the second partition wall 172, one portion is provided with one second driving element 182 and the other portion is provided with one micro LED 12.

The micro LED display panel 300 further includes a first insulating layer 13 laminated on a side of the back plate 11, a conductive layer 14 laminated on a side of the first insulating layer 13 away from the back plate 11, and a second insulating layer 15 laminated on a side of the conductive layer 14 away from the back plate 11. The first insulating layer 13, the conductive layer 14, and the second insulating layer 15 are formed in the light-emitting regions 173 and does not cover the first partition wall 171 or the micro LEDs 12. A thickness of the first insulating layer 13 is less than the thickness of the second partition wall 172. The first insulating layer 13 does not infill the groove 174.

The conductive layer 14 also extends into the groove 174 to electrically couple to the second driving element 182. A total thickness of the first insulating layer 13 plus the conductive layer 14 is greater than the thickness of the second partition wall 172 but less than a thickness of the first partition wall 171. A total thickness of the first insulating layer 13, the conductive layer 14, and the second insulating layer 15 is not more than a thickness of the first partition wall 171. Each of the micro LEDs 12 is embedded in the first insulating layer 13, the conductive layer 14, and the second insulating layer 15 and is surrounded by these layers 13, 14, and 15.

Each of the micro LEDs 12 includes an upper electrode 122, a lower electrode 121 opposite to the upper electrode 122, and a side electrode 123. The lower electrode 121 is on a side of the micro LED 12 adjacent to the back plate 11 and the upper electrode 122 is on a side of the micro LED 12 away from the back plate 11. The lower electrode 121 of the micro LED is electrically coupled to one of the first driving elements 181 by a solder 19. The side electrode 123 is between the upper electrode 122 and the lower electrode 121 and is spaced from both the upper electrode 122 and the lower electrode 121. That is, the lower electrode 121, the upper electrode 122, and the side electrode 123 are electrically insulated from each other. The side electrode 123 is in direct contact with the conductive layer 14.

The conductive layer 14 is electrically coupled to the side electrode 123 of each of the micro LEDs 12 to provide a bias voltage for the micro LEDs 12.

The micro LED display panel 100 further includes a common electrode 16 on the back plate 11, the common electrode 16 covers the second insulating layer 15 and each of the micro LEDs 12. The common electrode 16 is electrically coupled to the upper electrode 122 of the micro LED 12. When one voltage is applied to the upper electrode 122 by the common electrode 16, and a different voltage is applied to the lower electrode 121 by the first driving element 181, the micro LED 12 can emit light.

In the first embodiment of the present disclosure, the first insulating layer 13, the conductive layer 14, and the second insulating layer 15 are all deposited by inkjet printing, the deposition thicknesses can be controlled by controlling the amount of ink droplets.

Figure 15:
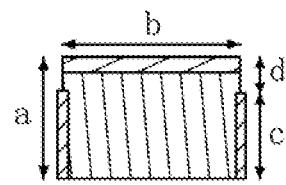
FIG. 15 shows some proportionalities of the micro LED display panel.
Figure 15:
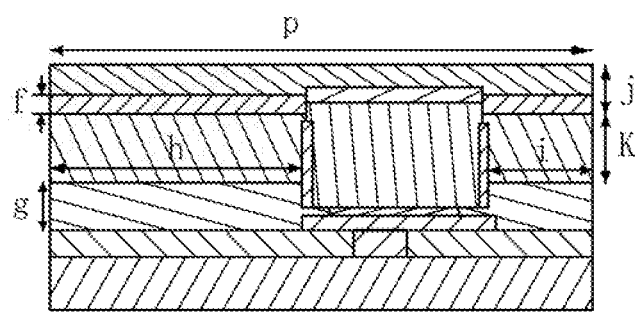
Figure 15:
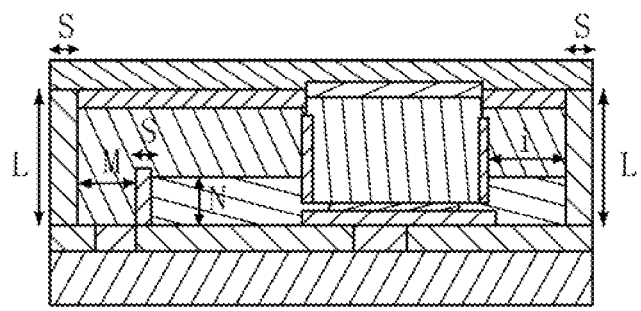
Figure 15:
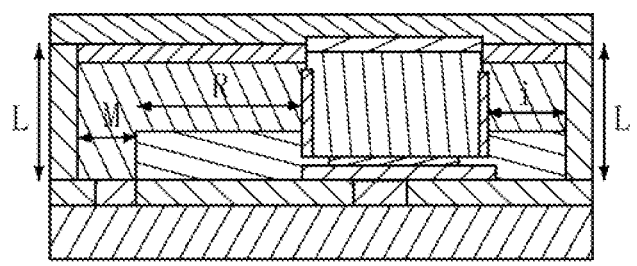

FIG. 15 indicates sizes of components of the micro LED display panel, the ranges of sizes are listed in the Table 1 following. Wherein a is a thickness of the micro LED 12 with the upper electrode 122, b is a diameter of the micro LED 12, c is a height of the side electrode 123 of the micro LED 12, and d is a difference between a and c. f is a thickness of the second insulating layer 15, g is a thickness of the first insulating layer 13 in the first embodiment, and h is a longer distance between adjacent two micro LEDs 12. i is a shorter distance between adjacent micro LEDs 12. A distance between the micro LED 12 and the adjacent first partition wall 171 in the second embodiment and in the third embodiment is also represented by i. j is a total thickness of the second insulating layer 15 and the common electrode 16, K is a thickness of the conductive layer 14, and L is a thickness of the first partition wall 171. S is a width of the first partition wall 171 or of the second partition wall 172, and M is a distance between the second partition wall 172 and the first partition wall 171 in same light-emitting region 173 in the third embodiment. M is also a diameter of the through hole 131 in the second embodiment, and R is a distance between the second partition wall 172 and the micro LED 12 in same light-emitting region in the third embodiment. N is a thickness of the first insulating layer 13 in the third embodiment.

TABLE 1

| | |
|---|---|
| $1\ \mu m \leq a \leq 3\ \mu m$ | $0.1\ \mu m \leq j \leq 2\ \mu m$ |
| $1\ \mu m \leq b \leq 15\ \mu m$ | $1.0\ \mu m \leq k \leq 3\ \mu m$ |
| $1\ \mu m \leq c \leq 3\ \mu m$ | $2.5\ \mu m \leq L \leq 4.5\ \mu m$ |
| $0.2\ \mu m \leq d \leq (a - c)\ \mu m$ | $1\ \mu m \leq M \leq h\ \mu m$ |
| $0\ \mu m \leq f \leq 1\ \mu m$ | $0\ \mu m \leq N \leq L\ \mu m$ |
| $0\ \mu m \leq g \leq 2\ \mu m$ | $19\ \mu m \leq P \leq 200\ \mu m$ |
| $15\ \mu m \leq h \leq 90\ \mu m$ | $(h - M)\ \mu m \leq R \leq h\ \mu m$ |
| $15\ \mu m \leq i \leq 90\ \mu m$ | $1\ \mu m \leq S \leq 4\ \mu m$ |

Table 2 shows estimated dimensions of the droplets during inkjet printing.

TABLE 2

| Volume of droplet (pL) | Diameter of droplet (μm) |
|---|---|
| 1.0 | 9.09 |
| 2.0 | 11.45 |
| 5.0 | 15.54 |
| 10.0 | 19.57 |

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A micro light emitting diode (LED) display panel, comprising:
 a back plate;
 a plurality of micro LEDs on the back plate;
 a first partition wall on a side of the back plate having the plurality of micro LEDs installed thereon, the first partition wall dividing the back plate into a plurality of light-emitting regions independent from each other, each of the plurality of light-emitting regions being provided with one of the plurality of micro LEDs;
 an insulating layer on the back plate, the insulating layer being located in each of the plurality of light-emitting regions and surrounding each of the plurality of micro LEDs; and
 a common electrode on the insulating layer and covering the plurality of micro LEDs;
 wherein a plurality of first driving elements and a plurality of second driving elements are formed on the back plate; each of the plurality of first driving elements is between the back plate and one of the plurality of micro LEDs;
 wherein the insulating layer comprises a first insulating layer laminated on the back plate and a second insulating layer laminated on a side of the first insulating layer away from the back plate;
 a conductive layer is laminated between the first insulating layer and the second insulating layer;
 any of the first insulating layer, the conductive layer, and the second insulating layer does not cover a side of the first partition wall away from the back plate.

2. The micro LED display panel of claim 1, wherein each of the plurality of micro LEDs comprises an upper electrode, a lower electrode, and a side electrode; the lower electrode is on a side of the micro LED adjacent to the back plate and electrically coupled to one of the plurality of first driving elements; the upper electrode is on a side of the micro LED away from the back plate and electrically coupled to the common electrode; the side electrode is between the upper electrode and the lower electrode and spaced apart from both the upper electrode and the lower electrode, the side electrode is electrically coupled to the conductive layer.

3. The micro LED display panel of claim 1, wherein the first insulating layer defines a plurality of through holes, each of the through holes aligns with one of the plurality of second driving elements, the conductive layer extends into the plurality of through holes to electrically couple to the plurality of second driving elements.

4. The micro LED display panel of claim 1, wherein a total thickness of the first insulating layer, the conductive layer, and the second insulating layer is equal to or less than a thickness of the first partition wall.

5. The micro LED display panel of claim 1, further comprising a plurality of second partition walls on the back plate, wherein each of the plurality of second partition walls is located in one of the plurality of light-emitting regions; and a thickness of each of the plurality of second partition walls is less than a thickness of the first partition wall.

6. The micro LED display panel of claim 5, wherein each of the plurality of second partition walls and the first partition wall form a groove in one of the plurality of light-emitting regions; the groove aligns with one of the plurality of second driving elements, the conductive layer extends into the groove to electrically couple to the plurality of second driving elements.

7. The micro LED display panel of claim 6, wherein the first insulating layer does not fill in the groove and does not cover a side of the plurality of second partition walls away from the back plate, a thickness of the first insulating layer is less than a thickness of the second partition wall, a total thickness of the first insulating layer and the conductive layer is greater than the thickness of the second partition wall and less than a thickness of the first partition wall.

8. A method for making a micro light emitting diode (LED) display panel, comprising:
 providing a back plate;
 forming a plurality of micro LEDs on the back plate;
 forming a first partition wall on a side of the back plate having the plurality of micro LEDs installed thereon, the first partition wall dividing the back plate into a plurality of light-emitting regions independent from each other, each of the plurality of light-emitting regions being provided with one of the plurality of micro LEDs;
 forming an insulating layer on the back plate, the insulating layer being located in each of the plurality of light-emitting regions and surrounding each of the plurality of micro LEDs; and
 forming a common electrode on the insulating layer and covering the plurality of micro LEDs;
 wherein the method further comprises forming a plurality of first driving elements and a plurality of second driving elements on the back plate before forming the plurality of micro LEDs on the back plate; each of the plurality of first driving elements is between the back plate and one of the plurality of micro LEDs;
 wherein forming the insulating layer comprises forming a first insulating layer on the back plate and forming a second insulating layer on the first insulating layer away from the back plate; the method further comprises forming a conductive layer between the first insulating layer and the second insulating layer; any of the first insulating layer, the conductive layer, and the second insulating layer does not cover a side of the first partition wall away from the back plate.

9. The method of claim 8, wherein each of the plurality of micro LEDs comprises an upper electrode, a lower electrode, and a side electrode; the lower electrode is on a side of the micro LED adjacent to the back plate and electrically coupled to one of the plurality of first driving elements; the upper electrode is on a side of the micro LED away from the back plate and electrically coupled to the common electrode; the side electrode is between the upper electrode and the lower electrode and spaced apart from both the upper electrode and the lower electrode, the side electrode is electrically coupled to the conductive layer.

10. The method of claim 8, wherein the method further comprises defining a plurality of through holes in the first insulating layer before forming the conductive layer; each of the through holes aligns with one of the plurality of second driving elements; a step of forming the conductive layer comprises forming the conductive layer into the plurality of through holes to electrically couple to the plurality of second driving elements.

11. The method of claim 8, wherein a total thickness of the first insulating layer, the conductive layer, and the second insulating layer is equal to or less than a thickness of the first partition wall.

12. The method of claim 8, further comprising forming a plurality of second partition walls on the back plate before forming the insulating layer on the back plate; wherein each of the plurality of second partition walls is located in one of the plurality of light-emitting regions; and a thickness of each of the plurality of second partition walls is less than a thickness of the first partition wall.

13. The method of claim 12, wherein each of the plurality of second partition walls and the first partition wall form a groove in one of the plurality of light-emitting regions; the groove aligns with one of the plurality of second driving elements, a step of forming the conductive layer comprises forming the conductive layer into the groove to electrically couple to the plurality of second driving elements.

14. The method of claim 13, wherein the first insulating layer does not fill in the groove and does not cover a side of the plurality of second partition walls away from the back plate, a thickness of the first insulating layer is less than a thickness of the second partition wall, a total thickness of the first insulating layer and the conductive layer is greater than the thickness of the second partition wall and less than a thickness of the first partition wall.

* * * * *